United States Patent [19]

Yamanoi et al.

[11] Patent Number: 4,758,738

[45] Date of Patent: Jul. 19, 1988

[54] TIMING SIGNAL GENERATING APPARATUS

[75] Inventors: Koyu Yamanoi; Yoshio Yoshizakiya, both of Tokyo, Japan

[73] Assignee: Ando Electric Co., Ltd, Tokyo, Japan

[21] Appl. No.: 45,098

[22] Filed: May 1, 1987

[30] Foreign Application Priority Data

May 6, 1986 [JP] Japan .................. 61-103649

[51] Int. Cl.$^4$ .............................................. H03K 5/13
[52] U.S. Cl. .................................. 307/269; 307/603; 328/55; 328/63
[58] Field of Search .............. 307/269, 600, 601, 603, 307/608, 597; 328/55, 63; 377/20

[56] References Cited

U.S. PATENT DOCUMENTS

| 3,952,253 | 4/1976 | DeVolpi et al. | 328/63 |
| 4,131,855 | 12/1978 | Hamagawa | 328/129.1 |
| 4,306,190 | 12/1981 | Beckwith et al. | 307/271 |
| 4,450,560 | 5/1984 | Conner | 371/27 |
| 4,523,289 | 6/1985 | Soma et al. | 377/20 |
| 4,555,663 | 11/1985 | Shimizu | 371/27 |
| 4,573,175 | 2/1986 | Cressey et al. | 307/271 |
| 4,584,683 | 4/1986 | Shimizu | 371/27 |
| 4,680,479 | 7/1987 | Alonso | 307/271 |
| 4,719,375 | 1/1988 | Martin | 328/63 |

FOREIGN PATENT DOCUMENTS

| 0208049 | 1/1987 | European Pat. Off. | 307/269 |
| 0067869 | 4/1985 | Japan | 307/269 |
| 0096023 | 5/1985 | Japan | 307/269 |
| 0075615 | 4/1986 | Japan | 307/269 |
| 2070827 | 9/1981 | United Kingdom | 307/269 |

Primary Examiner—John S. Heyman
Assistant Examiner—Tai V. Duong
Attorney, Agent, or Firm—Seidel, Gonda, Goldhammer & Abbott

[57] ABSTRACT

A timing signal generating apparatus comprises a first shift register having an input supplied with a first select signal and shifting the first select signal with a first reference clock signal, a second shift register having an input supplied with timing data for shifting the timing data with the first reference clock signal, a first selector having an input supplied with the output of the first shift register and extracting the output from the first shift register at a position corresponding to the stage designated by a second select signal, a second selector having an input supplied with the output of the second shift register for producing the output from the second shift register at a position corresponding to the stage designated by the second select signal, a gate circuit having inputs supplied with a second reference clock signal delayed in phase relative to the first reference clock and the output of the first selector, respectively, a counter for counting a clock signal of a repetition period shorter than that of the first reference clock signal, the counter being reset in response to the output of the gate circuit, a setting circuit having an address input supplied with the output of the second selector, an inhibit signal generating circuit having an input supplied with the second select signal, and a coincidence detection circuit having inputs supplied with the output of the counter, the output of the inhibit signal generating circuit and the output of the setting circuit, respectively. The coincidence detection circuit responds to the output of the inhibit signal generating circuit to be inhibited from producing the output for the period during which the second select signal is changed over. The timing signal derived from the coincidence detection circuit is delayed for a time equal to a sum resulting from the addition of the period of the reference clock signal multiplied with the stage number of the shift registers and a value set at the setting circuit.

1 Claim, 4 Drawing Sheets

TIMING SIGNAL GENERATING APPARATUS

BACKGROUND OF THE INVENTION

1. Field of the Invention

The present invention relates to a timing signal generating apparatus capable of generating a timing signal delayed relative to a reference clock signal for a time longer than a period of the reference clock signal.

2. Description of the Prior Art

For having a better understanding of the present invention, a hitherto known timing signal generating circuit will be described in some detail by referring to FIGS. 3 and 4 of the accompanying drawings.

In FIG. 3 which shows a general arrangement of a hitherto known timing signal generating apparatus, a reference numeral 11 denotes a change-over circuit, a numeral 12 denotes a setting circuit, numerals 13a and 13b denote counters, respectively, numerals 14a and 14b denote coincidence detection circuits, respectively, a numeral 15 denotes a gate circuit, numerals 16a to 16c denote input terminals, respectively, and a reference numeral 16d denotes an output terminal.

The timing signal generating apparatus shown in FIG. 3 is designed to derive a timing signal 20 which is delayed relative to a reference clock signal 17 for a time longer than the period of the reference clock signal 17. To this end, each of the counter 13a and 13b is placed with predetermined delay time data for thereby allowing the timing signal to be generated with a delay of the abovementioned duration relative to the reference clock signal 17 by counting clock pulses 19.

Operation of the timing signal generating apparatus shown in FIG. 3 will be elucidated by referring to a timing chart illustrated in FIG. 4.

Applied to the input terminal 16a is the reference clock signal 17 shown in FIG. 4 at (a), while a timing data signal 18 shown in FIG. 4 at (b) is applied to the input terminal 16b. The timing data signal 18 represents address designation information supplied to the setting circuit 12 where the output data to be loaded in the counters 13a and 13b are stored, as described hereinafter. The input terminal 16c is supplied with the clock pulses 19 for the counters 13a and 13b. The timing signal 20 shown in FIG. 4 at (h) is derived from the output terminal 16d.

The reference clock signal 17 serves to determine the period of the timing data signal 18. More specifically, the period of the reference clock signal 17 is equal to the period or time interval at which the timing data signal 18 is changed over.

The clock pulse signal 19 has a period shorter than that of the reference clock signal 17 and is applied to the counter 13a and 13b.

The change-over circuit 11 operates to apply alternately the reference clock signal 17 to the counters 13a and 13b. The setting circuit 12 serves to load the output data C and C1 shown in FIG. 4 at (c) to the counters 13a and 13b, which data C and C1 are previously stored in the setting circuit 12 at the locations designated by the timing data signal 18.

In response to the reference clock signal 17 applied through the change-over circuit 11, the counter 13a is placed with the output data C or C1 supplied from the setting circuit 12.

A signal shown in FIG. 4 at (d) corresponds to the reference clock signal 17a shown in FIG. 4 at (a) and derived through the change-over circuit 11 and is a applied to the counter 13a. The signal shown in FIG. 4 at (d) serves to load the output data C shown in FIG. 4 at (c) in the counter 13a. The latter counts the clock pulses 19 in a number corresponding to the output data C.

Shown in FIG. 4 at (e) is a waveform of the output signal of the coincidence detection circuit 14a which is produced when the output signal representative of the content of the counter 13a becomes "0" level.

Shown in FIG. 4 at (f) is a signal which corresponds to the reference clock signal 17b derived through the change-over circuit 11 and is applied to the counter 13b.

The signal shown in FIG. 4 at (f) serves to place the output data C1 shown in FIG. 4 at (c) in the counter 13b which counts the clock pulses 19 by a number corresponding to the output data C1.

Shown in FIG. 4 at (g) is a signal waveform which is outputted from the coincidence detection circuit 14b when the content of the counter 13b becomes "0".

By way of example, it is assumed that the period of the reference clock signal 17 shown in FIG. 3 is 1 mS (millisecond) and that of the clock pulse 19 is 1 $\mu$S. On the assumption, in order to derive the timing signals shown in FIG. 4 at (e) and (g) which are delayed for 1.3 mS relative to the reference clock signals 17a and 17b, respectively, it is required that such data be previously stored in the setting circuit 12 that the output data C and C1 shown in FIG. 4 at (c) represent, respectively, a value "1300" which corresponds to the delay time or lag of 1.3 mS.

As will be appreciated from the foregoing description, in order that the hitherto known timing signal generating apparatus can generate the timing signal delayed relative to the reference signal 17 for a time longer than the period of the latter, the use of the additional counter 13b is indispensable because the reference clock signal succeeding to the one which has triggered the counting operation of the counter 13a makes appearance in the course of the counting operation of the latter 13a, to involve expensiveness in implementation of the timing signal generating apparatus. Another disadvantage of the hitherto known timing signal generating apparatus shown in FIG. 3 is seen in the fact that with two loops each including the counter and the coincidence detection circuit, it is only possible to generate the timing signal delayed to the reference clock signal 17 for a time which is not longer than a sum of two periods of the reference clock signal 17. Of course, the circuit arrangement shown in FIG. 3 may be so modified that the timing signal can be generated with a delay of magnitude greater than two periods of the reference clock signal. To this end, however, the number of the sets of the counter and the coincidence detection circuit must be increased, which means that the circuit arrangement becomes correspondingly complicated, thus giving rise to a problem.

SUMMARY OF THE INVENTION

It is therefore an object of the present invention to provide a timing signal generating apparatus which is immune to the drawbacks of the hitherto known apparatus described above and which can also generate such a timing signal which is delayed relative to a reference clock signal for a time longer than a sum of two periods of the reference clock signal.

In view of the above object, it is taught by the present invention that shift registers and a counter are employed and so arranged that the timing signal as generated can be delayed for a time corresponding to a sum of the product of the period of the reference clock signal multiplied with the number of the stages of the shift register and a time corresponding to a value set previously in the counter.

The present invention thus resides in a timing signal generating which comprises a first shift register having an input supplied with a first select signal and shifting the first select signal with a first reference clock signal, a second shift register having an input supplied with timing data for shifting the timing data with the first reference clock signal, a first selector having an input supplied with the output of the first shift register and extracting the output from the first shift register at a position corresponding to the state designated by a second select signal, a second selector having an input supplied with the output of the second shift register for producing the output from the second shift register at a position corresponding to the state designated by the second select signal, a gate circuit having inputs supplied with a second reference clock signal delayed in phase relative to the first reference clock and the ouput of the first selector, respectively, a counter for counting a clock signal of a repetition period shorter than that of the first reference clock signal, the counter being reset in response to the ouput of the gate circuit, a setting circuit having an address input supplied with the output of the second selector, an inhibit signal generating circuit having an input supplied with the second select signal, and a coincidence detection circuit having inputs supplied with the output of the counter, the output of the inhibit signal generating circuit and the output of the setting circuit, respectively, wherein the coincidence detection circuit responds to the output of the inhibit signal generating circuit to be inhibited from producing the ouput for the period during which the second select signal is changed over and a timing signal from the coincidence detection circuit is delayed for a time equal to a sum resulting from the addition of the period of the reference clock signal multiplied with the designated number of stages of the shift registers and a value set at the setting circuit.

The above and other objects, novel features and advantages of the present invention will be better understood upon consideration of the following description of the preferred embodiments thereof taken in conjunction with the accompanying drawings.

DESCRIPTION OF THE PREFERRED EMBODIMENTS

Now, the invention will be described in conjunction with an exemplary embodiment thereof.

Figure 1:
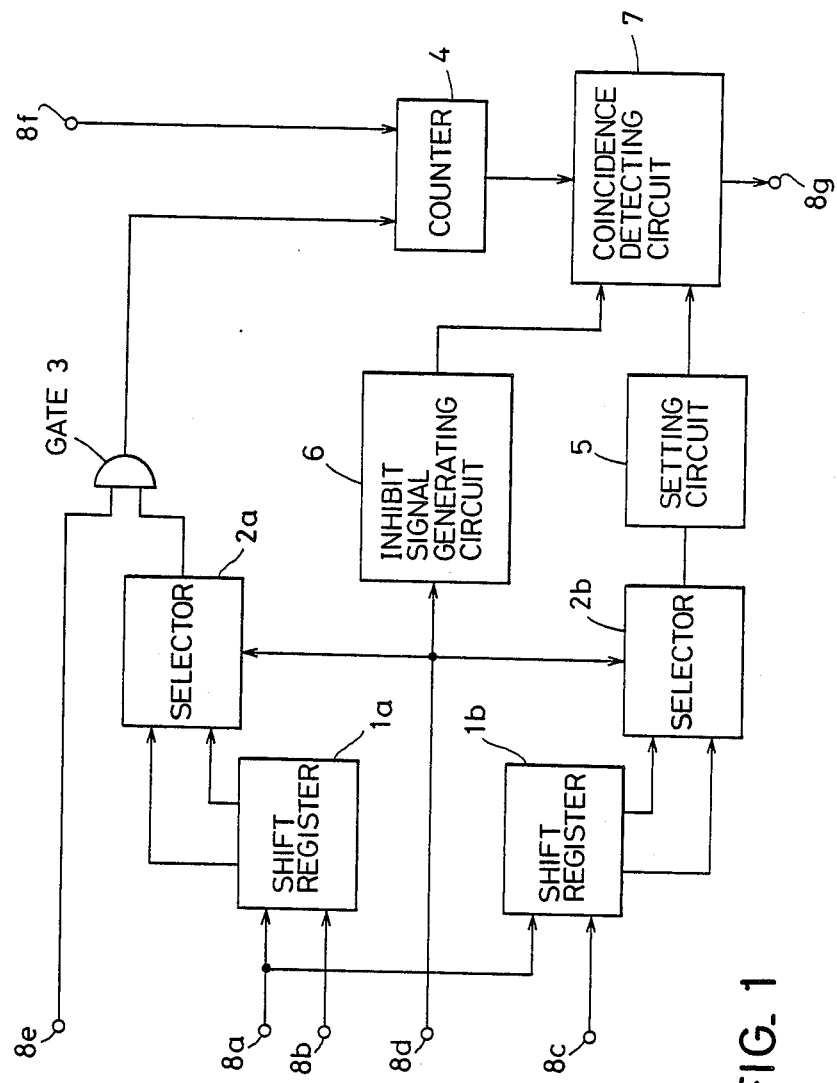
FIG. 1 is a view showing in a block diagram a general arrangement of a timing signal generating apparatus according to an exemplary embodiment of the present invention.

FIG. 1 shows in a block diagram a general arrangement of the timing signal generating apparatus according to an embodiment of the present invention. In the figure, reference symbols $1a$ and $1b$ denote shift registers, respectively, $2a$ and $2b$ denote selectors, respectively, 4 denotes a counter, 5 denotes a setting circuit, 6 denotes an inhibit signal generating circuit, 7 denotes a coincidence detection circuit, $8a$ to $8f$ denote input terminals, and the reference numeral $8g$ denotes an output terminal. Interconnection of these components will be self-explanatory from FIG. 1.

Operation of the timing signal generating apparatus shown in FIG. 1 will be described below by referring to the timing chart shown in FIG. 2.

A reference clock signal $9a$ shown in FIG. 2 at (a) is applied to the input terminal $8a$ to be subsequently supplied to the shift registers $1a$ and $1b$.

Figure 2:
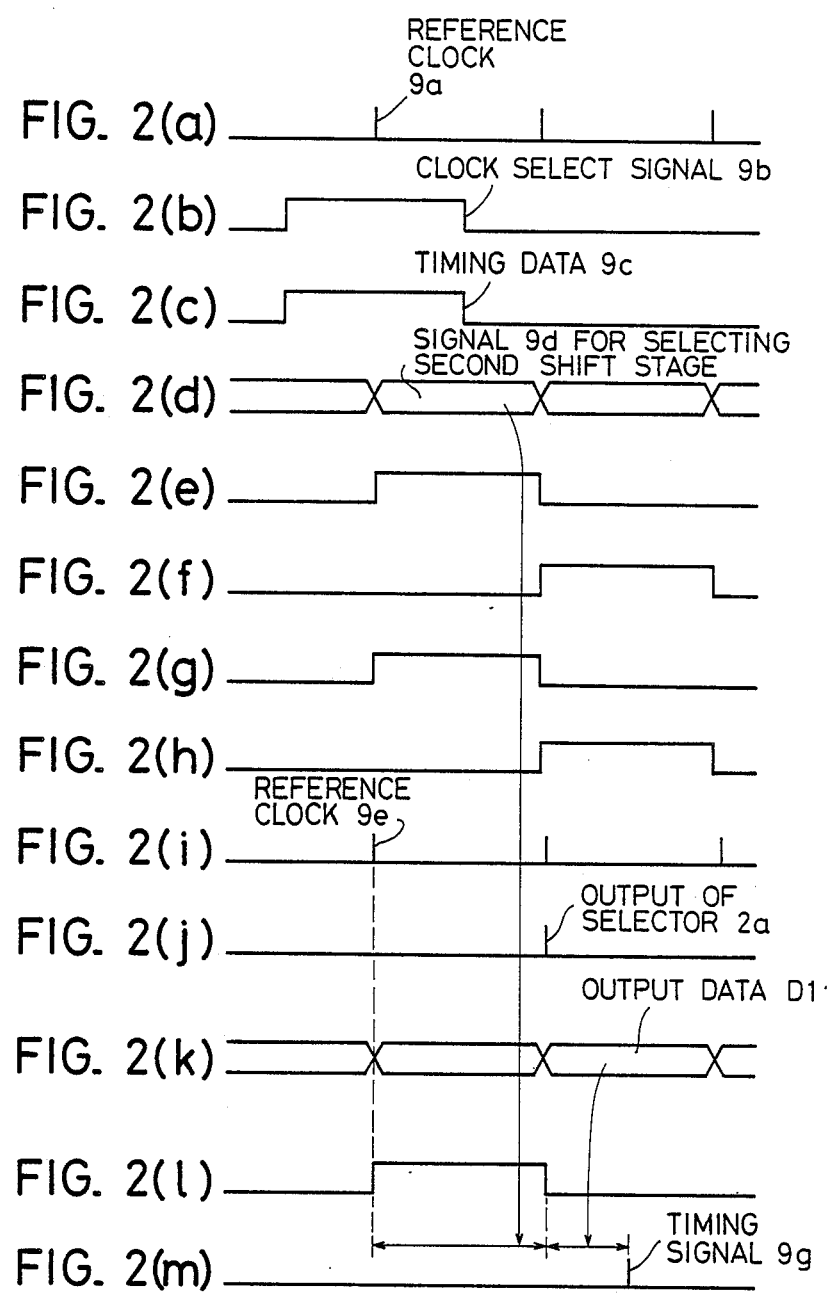
FIG. 2 is a view showing a timing chart for illustrating the operation of the timing signal generating apparatus shown in FIG. 1.

The input terminal $8b$ is applied with a clock select signal $9b$ shown in FIG. 2 at (b), while a timing data signal $9c$ shown in FIG. 2 at (c) is applied to the input terminal $8c$. Further, a select signal $9d$ shown in FIG. 2 at (d) is applied to the input terminal $8d$, while a reference clock signal $9e$ shown in FIG. 2 at (i) is applied to the input terminal $8e$. The input terminal $8f$ is applied with a clock pulse $9f$ for the counting operation. The timing signal $9g$ shown in FIG. 2 at (m) is generated from the output terminal $8g$.

In the following description, it is assumed that the select signal $9d$ shown in FIG. 2 at (d) is so set as to select the output of the second stage of the shift register $1a$ and $1b$, respectively, for the period of the reference clock signal $9a$ shown in FIG. 2 at (a).

Although the timing signal generating apparatus shown in FIG. 1 is so arranged as to generate the timing signal $9g$ delayed relative to the reference clock signal $9a$ for a time shorter than the sum of two periods of the reference clock signal $9a$, it will be appreciated that the timing signal delayed for a time longer than the sum of two periods of the reference clock signal $9a$ can also be generated by simply increasing the number of the stages of the shift registers $1a$ and $1b$ in the same arrangement as the one shown in FIG. 1.

Figure 3:
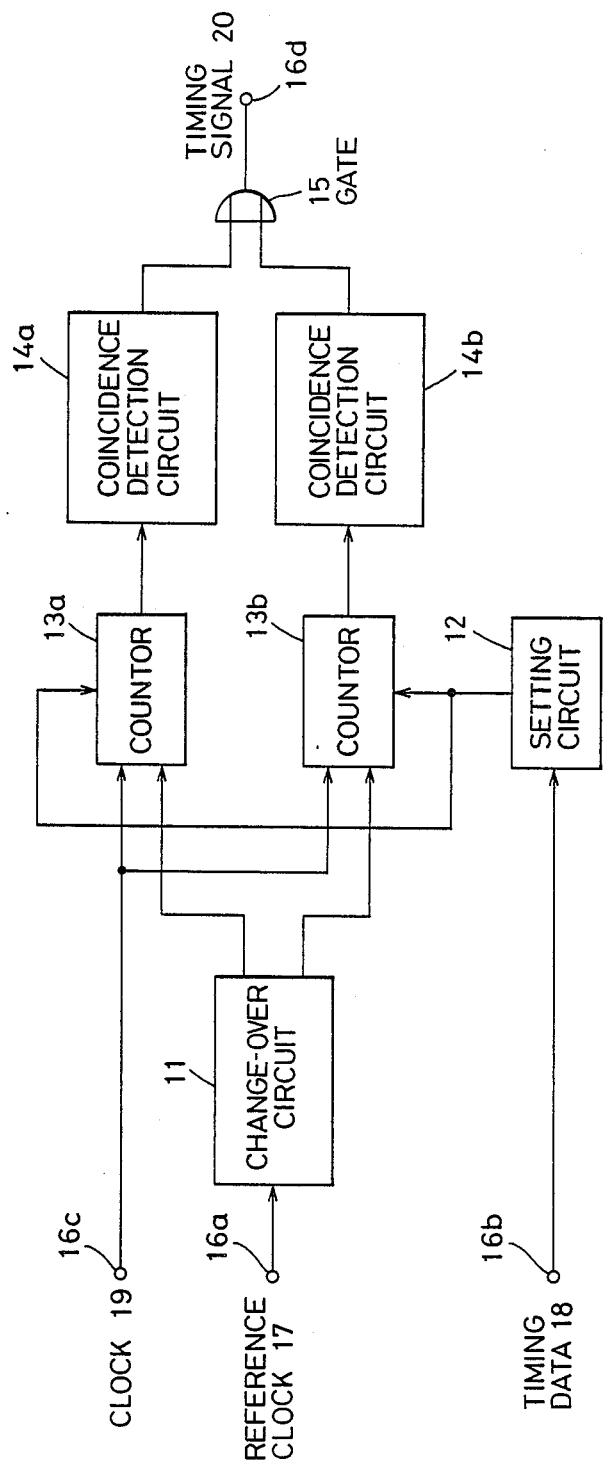
FIG. 3 is a view showing in a block diagram a circuit arrangement of a hitherto known timing signal generating apparatus.
Figure 4A:
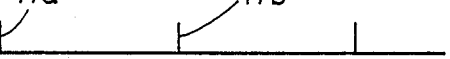
FIG. 4 is a view showing a timing chart for illustrating the operation of the timing signal generating apparatus shown in FIG. 3.
Figure 4B:
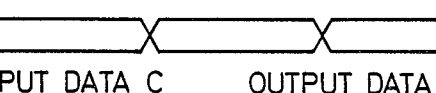
Figure 4C:
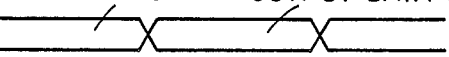
Figure 4D:
Figure 4E:
Figure 4F:
Figure 4G:
Figure 4H:
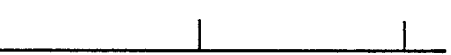

The reference clock signal $9a$ used in the timing signal generating apparatus shown in FIG. 1 is same as the reference clock signal 17 used in the apparatus shown in FIG. 3, while the timing data $9c$ used in the apparatus shown in FIG. 1 is of the same structure as the data 18 used in the apparatus shown in FIG. 3.

The clock select signal $9b$ serves as the signal for selecting the reference clock signal $9e$ which is delayed in phase a little relative to the reference clock signal $9a$. The reference clock signal $9e$ is delayed more than a delay time involved due to operation of the shift $1a$ and the selector $2a$.

The clock pulse signal $9f$ is same as the one 19 used in the apparatus shown in FIG. 3.

The shift register $1a$ shifts the clock select signal $9b$ in response to the reference clock signal $9a$, wherein the output of the shift register $1a$ is applied to the selector $2a$.

On the other hand, the shift register $1b$ shifts the timing data $9c$ in response to the reference clock singal $9a$, wherein the output of the shift register $1b$ is applied to the selector $2b$.

In the case of the embodiment illustrated in FIG. 1, it is assumed that each of the shift registers $1a$ and $1b$ is realized in two shift stages. Thus, when the output of the second stage of the shift register is selected by the select signal 9d, the timing signal 9g which is delayed for a time corresponding to one period of the reference clock signal 9a can be derived.

Illustrated in FIG. 2 at (e) is the waveform of the signal outputted from the first stage of the shift register 1a, while the waveform of the signal outputted from the second stage of the shift register 1a is shown at (f) in FIG. 2.

The selector 2a applies to the gate circuit 3 the output of the shift register 1a derived from the stage of the shift register 1a designated by the select signal 9d.

Shown in FIG. 2 at (g) is the waveform of the signal outputted from the first stage of the shift register 1b while the waveform of the signal outputted from the second stage of the shift register 1b is shown in FIG. 2 at (h).

The selector 2b applies to the setting circuit 5 the output signal of the shift register 1b from the stage designated by the select signal 9d.

When the output of the selector 2a becomes logic "1", as is shown in FIG. 2 at (j), the gate 3 supplies the reference clock signal 9e to the counter 4 to thereby reset the counter 4.

The counter 4 in turn counts the clock pulses 9f, wherein the output data of the counter 4 is fed to the coincidence detection circuit 7.

The setting circuit 5 receives the output of the selector 2b as the address input signal to thereby supply the data stored at the address designated by the output data of the selector 2b to the coincidence detection circuit 7.

The coincidence detection circuit 7 produces the timing signal 9g when the output data of the counter 4 coincides with the output data of the setting circuit 5. The output data D1 of the setting circuit 5 is shown in FIG. 2 at (k).

The output of the inhibit signal generating circuit 6 is inputted to the coincidence detection circuit 7 to thereby inhibit the timing signal 9g from being produced for a time equal to the period of the reference clock signal multiplied with the stage number designated by the select signal 9d even when the output data of the counter 4 coincides with that of the setting circuit 5. The output signal of the inhibit signal generating circuit 6 is shown in FIG. 2 at (l).

The sum resulting from the addition of the selected data 9d at the second stage shown in FIG. 2 at (d) and the output data shown in FIG. 2 at (k) can be derived from the output terminal 8g as the timing signal 9g shown in FIG. 2 at (m).

In the case of the circuit arrangement shown in FIG. 1, the timing signal 9g is derived with a delay time equal to the sum of the product of the period of the reference clock signal multiplied with the stage number of the shift register 1a or 1b selected by the select signal 9d and the time corresponding to the output data placed in the setting circuit 5.

By way of example, it is assumed that the period of the reference clock pulse 9a shown in FIG. 1 is 1 mS and that the period of the clock pulse signal 9f is 1 μS. On the assumption, in order to derive the timing signal shown in FIG. 2 at (m) and delayed 1.3 mS relative to the reference clock signal 9e shown in FIG. 2 at (i), arrangement has to be made such that the output of the second stage of the shift register 1a, 1b is selected or designated by the select signal 9d shown in FIG. 2 at (d) and that the output data D1 previously placed in the setting circuit 5 and shown in FIG. 2 at (k) is "300".

It should be mentioned that the timing signal can be generated which is delayed for a time shorter than one period of the reference clock signal 9a. In that case, the output of the first stage of the shift register 1a, 1b may be made use of.

As will be appreciated from the foregoing description, the timing signal generating apparatus including the shift registers and the counter according to the present invention allows the timing signal to be generated with a delay relative to the reference clock signal 9a which delay amounts to the time longer than the sum of the time corresponding to the value previously placed in the counter and the time equal to the period of the reference clock signal multiplied with the stage number of the shift register.

Although the invention has been described in conjunction with the exemplary embodiment which is believed to be preferred at present, it will be understood that many and various modifications and versions may readily occur to those skilled in the art without departing from the spirit and scope of the invention.

We claim:

1. A timing signal generating apparatus, comprising:
a first shift register having an input supplied with a first select signal and shifting said first select signal with a first reference clock signal;
a second shift register having an input supplied with timing data for shifting said timing data with said first reference clock signal;
a first selector having an input supplied with the output of said first shift register and extracting the output from said first shift register at a position corresponding to the stage designated by a second select signal;
a second selector having an input supplied with the output of said second shift register for producing the output from said second shift register at a position corresponding to the stage designated by said second select signal;
a gate circuit having inputs supplied with a second reference clock signal delayed in phase relative to said first reference clock and the output of said first selector, respectively;
a counter for counting a clock signal of a repetition period shorter than that of said first reference clock signal, said counter being reset in response to the output of said gate circuit;
a setting circuit having an address input supplied with the output of said second selector;
an inhibit signal generating circuit having an input supplied with said second select signal; and
a coincidence detection circuit having inputs supplied with the output of said counter, the output of said inhibit signal generating circuit and the output of said setting circuit, respectively;
wherein said coincidence detection circuit responds to the output of said inhibit signal generating circuit to be inhibited from producing the output for a period during which said second select signal is changed over and a timing signal is outputted from said coincidence detection circuit which timing signal is delayed for a time corresponding to a sum resulting from the addition of the period of said reference clock signal multiplied with the stage number of said shift registers and a value set at said setting circuit.

* * * * *